(12) United States Patent
Korhonen et al.

(10) Patent No.: US 7,905,404 B2
(45) Date of Patent: Mar. 15, 2011

(54) SMARTCARD AND METHOD OF PRODUCING SMARTCARDS

(75) Inventors: Maila Korhonen, Vantaa (FI); Mika Holmberg, Helsinki (FI); Jari Herlin, Helsinki (FI)

(73) Assignee: Setec Oy, Vantaa (FI)

( * ) Notice: Subject to any disclaimer, the term of this patent is extended or adjusted under 35 U.S.C. 154(b) by 253 days.

(21) Appl. No.: 12/067,776

(22) PCT Filed: Sep. 21, 2006

(86) PCT No.: PCT/FI2006/050405
§ 371 (c)(1),
(2), (4) Date: Aug. 8, 2008

(87) PCT Pub. No.: WO2007/034039
PCT Pub. Date: Mar. 29, 2007

(65) Prior Publication Data
US 2009/0065589 A1    Mar. 12, 2009

(30) Foreign Application Priority Data
Sep. 22, 2005   (EP) .................................... 05108761

(51) Int. Cl.
*G06K 7/08* (2006.01)
(52) U.S. Cl. .......................... 235/449; 235/380; 235/451
(58) Field of Classification Search .................. 235/492, 235/380, 441, 451, 487
See application file for complete search history.

(56) References Cited

U.S. PATENT DOCUMENTS

| | | | |
|---|---|---|---|
| 5,416,358 A | 5/1995 | Ochi et al. | |
| 6,173,898 B1* | 1/2001 | Mande | 235/488 |
| 6,659,355 B1* | 12/2003 | Fischer et al. | 235/492 |
| 7,207,494 B2* | 4/2007 | Theodossiou et al. | 235/487 |
| 2002/0154530 A1 | 10/2002 | Iwasaki et al. | |
| 2004/0182939 A1* | 9/2004 | Furst et al. | 235/492 |
| 2005/0019989 A1 | 1/2005 | Droz | |
| 2005/0035491 A1* | 2/2005 | Bagnall et al. | 264/272.11 |
| 2006/0226240 A1* | 10/2006 | Singleton | 235/492 |
| 2007/0176273 A1* | 8/2007 | Wolny | 257/679 |

FOREIGN PATENT DOCUMENTS

JP      61086886 A      5/1986

(Continued)

OTHER PUBLICATIONS

Yahya Haghiri et al., "Smart Card Manufacturing", John Wiley & Sons, Ltd., chapters 6, 7.2, 2.4.6, (2002).

(Continued)

*Primary Examiner* — Edwyn Labaze
(74) *Attorney, Agent, or Firm* — Panitch Schwarze Belisario & Nadel LLP

(57) ABSTRACT

The invention relates to a smartcard (1) comprising: a first section (4) enclosing a contactless microcircuit (2). In order to improve the security of the smart card against forgery said smartcard comprises: a compensation section (7) of a transparent material, said compensation section having substantially the same thickness as the first section (4) and surrounding said first section, a top section (5) of a transparent material, said top section being arranged on top of said first section (4) and said compensation section (7) as a surface layer of said smartcard (1), and a bottom section (6) of a transparent material, said bottom section being arranged under said first section (4) and said compensation section (7) as a surface layer of said smartcard (1).

12 Claims, 2 Drawing Sheets

FOREIGN PATENT DOCUMENTS

JP          2003303327 A     10/2003

OTHER PUBLICATIONS

Yahya Haghiri et al., "vom Plastik zur Chipkarte; 7.2 Kontaktlose Chipkarte", pp. 181-192, (1999).

Yahya Haghiri et al., "vom Plastik zur Chipkarte; Chipmodule", pp. 125-131, (1999).

Yahya Haghiri et al., "vom Plastik zur Chipkarte; Lasergravur", pp. 47-51, (1999).

Yahya Haghiri et al., "Smart Card Manufacturing", John Wiley & Sons, Ltd., chapters 6, pp. 102-113, (2002).

* cited by examiner

SMARTCARD AND METHOD OF PRODUCING SMARTCARDS

CROSS-REFERENCE TO RELATED APPLICATION

This application is a section 371 of International Application No. PCT/FI2006/050405, filed Sep. 21, 2006, which was published in the English language on Mar. 29, 2007 under International Publication No. WO 2007/034039 A1 and the disclosure of which is incorporated herein by reference.

BACKGROUND OF THE INVENTION

1. Field of the Invention

This invention relates to a smartcard with a contactless microcircuit, in other words a microcircuit capable of communicating with an external device without a need to establish a mechanical contact. The present invention relates more specifically to a smartcard with a sufficient protection against forgery in order to be suitable to be used as an identity card, for instance. The term 'smartcard' should in this application be interpreted to cover at least identity cards, driver's licenses, payment cards, credit cards and data sheets for passports.

2. Description of Prior Art

Previously there is known a smartcard with a contactless microcircuit. This smartcard has been manufactured of a non-transparent material, which has made it possible to hide the microcircuit in the card such that the microcircuit can not be seen.

A problem relating to the above mentioned smartcard is insufficient security against forgery. A forger might try to remove information which is marked on the card and to replace such removed information with some other information. In addition, a forger might try to split the card into pieces in order to replace a part of the smartcard. Such attempts might be difficult to observe due to the non-transparent material of the smartcard.

SUMMARY OF THE INVENTION

An object of the present invention is to solve the above mentioned drawback and to ensure that forgery attempts will always leave visible marks on the smartcard. This object is achieved with a smartcard as defined in independent claim 1 and with smartcards manufactured according to the method of independent claim 7.

The invention is based on the idea of providing the smartcard with transparent sections at the outer edges in order to ensure that marks caused by a forgery attempt are easy to observe in the transparent sections. Transparent section refers in this context to transparency in the range of visible light, ultra violet light or infrared light.

The thickness and the width of the first section enclosing the microcircuit cause problems regarding how to accomplish such transparent sections at the outer edges. To simply place the first section between two transparent layers which extend beyond the edges of the first section and which are laminated to each other in order to obtain transparent edges is not possible, because this would increase the size of the smartcard beyond acceptable dimensions.

In the present invention it is possible to limit the dimensions of the smartcard to an acceptable size by means of a compensation section of a transparent material. This compensation section is arranged to surround the first section. The top and bottom sections of the smartcard are attached to this compensation section. The dimensions of the smartcard can be kept acceptable as it is not necessary to let the top and bottom sections protrude over the edges of the first section to such an extent that they could be attached to each other. Instead they only protrude to such an extent that they can be attached to the compensation section. The result is a smartcard with an acceptable size and transparent sections at the outer edges, though the thickness and width required by the first section containing the contactless microcircuit is significant. Possible forgery can therefore be detected simply by looking at the smart card in visible light, ultra violet light or infrared light.

The preferred embodiments of the smartcard and the method of the invention are disclosed in the dependent claims 2-6 and 8-11.

BRIEF DESCRIPTION OF DRAWINGS

In the following the present invention will be described in closer detail by way of example and with reference to the attached drawings, in which.

DESCRIPTION OF AT LEAST ONE EMBODIMENT

Figure 1:
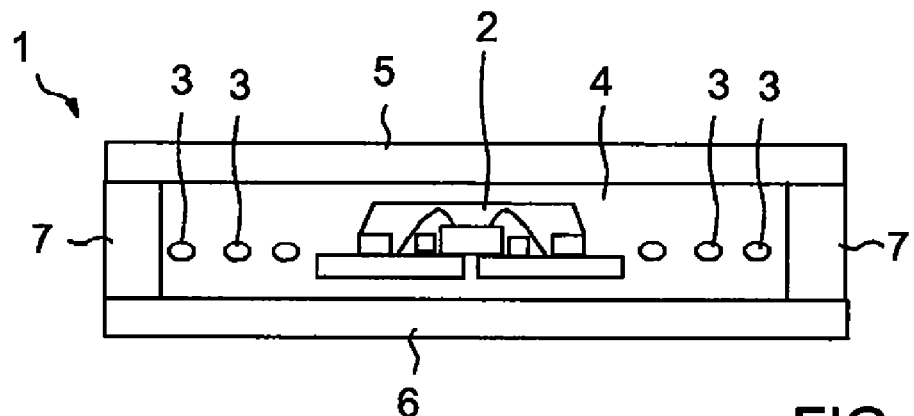
FIGS. 1 and 2 illustrate a first preferred embodiment of a smartcard according to the invention.
Figure 2:
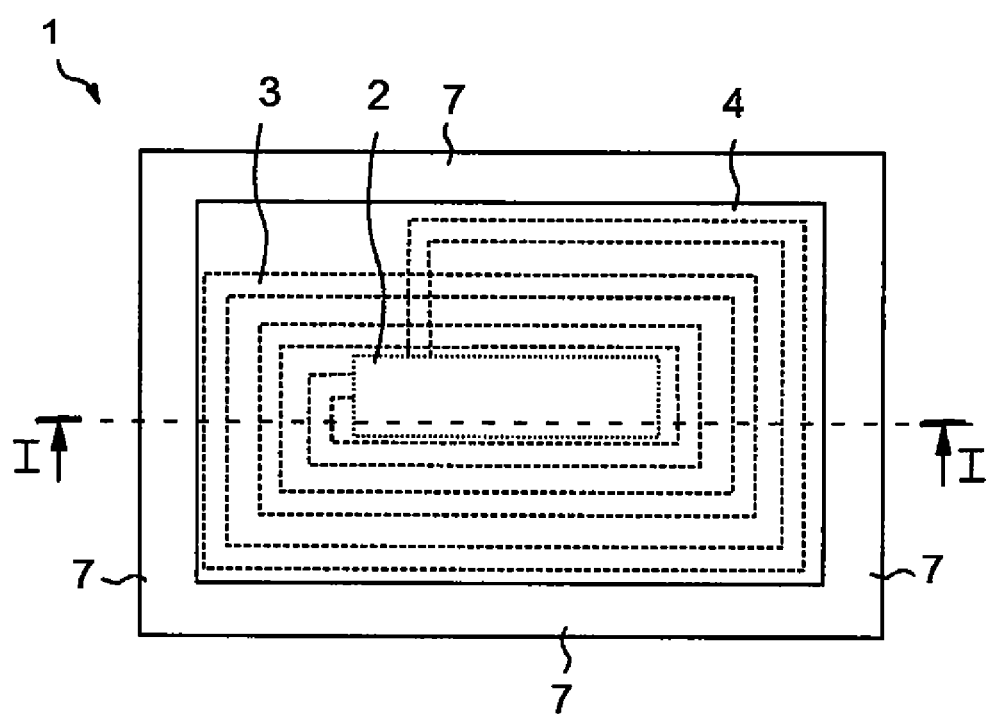

FIGS. 1 and 2 illustrate a first preferred embodiment of a smartcard according to the invention. FIG. 1 shows a cross section of a smartcard 1 along line I-I of FIG. 2, and FIG. 2 shows the smartcard 1 of FIG. 1 as seen from above. The smartcard shown in the figures can be used as an identity card, a driver's license, a payment card or as a data sheet of a passport, for instance.

The smartcard 1 includes a contactless microcircuit 2 including an antenna 3. The antenna 3 is shown in the figures as a wound. A contactless microcircuit refers to a microcircuit that can communicate with external equipment without the need of a mechanical contact between the microcircuit and the external equipment.

In order to provide sufficient protection the microcircuit 2 is preferably encapsulated into a protective material, for instance a plastic material. The coiled antenna 3 is, however, located outside this protective material. The height of such an encapsulated microcircuit is typically about 0.3-0.4 mm. In FIGS. 1 and 2 the microcircuit 2 including the antenna 3 is located in a first section 4 which encloses the microcircuit. The first section 4 may consist of several layers of a suitable plastic material. In that case the top and bottom layer are preferably intact while the layers between the top and bottom layer have holes dimensioned to receive the microcircuit. The coiled antenna is placed between the layers, and the layers are attached to each other for instance by laminating. With such a construction the height of the first section is typically about 0.4-0.6 mm. Since the total thickness of a smart card is typically about 0.7-0.9 mm, this height is considerable.

The material of the first section 4 is preferably non-transparent in the range of visible light in order to hide the microcircuit 2 and the antenna 3 and to make it easier to read text printed on the smartcard. Alternatively, the material of the first section 4 may be transparent, a protective non-transparent pattern (in the range of visible light) being arranged on the first section 4, the top section 5 or the bottom section 6 in order to hide the microcircuit 2 and the antenna 3 and to make printed text easier to read. A suitable material to be used in the first section is polycarbonate, for instance.

In FIGS. 1 and 2 it can be seen that the coiled antenna 3 requires a significant space in the first section 4. The space required by the coiled antenna is in practice very difficult to reduce, because this would make it difficult for the contactless microcircuit 2 to communicate with an external equipment.

In order to provide the smartcard 1 with transparent edges, a compensation section 7 with substantially the same thickness as the first section 4 is arranged to surround the first section. Thus, the thickness of the compensation section 7 should be close enough to the thickness of the first section 4 in order to ensure that the total thickness of the smartcard remains the same in all parts of the smartcard. The compensation section 7 and the top and bottom sections 5 and 6 are manufactured of a suitable transparent plastic material, such as polycarbonate, for instance. Thus instead of increasing the length of the top section 5 and the bottom section 6 to such an extent that they protrude far enough over the edges of the first section 4 in order to attach the top and bottom section to each other, a compensation section 7 is utilized in the present invention. Thus by attaching the top and bottom sections 5 and 6 to the compensation section 7, it becomes possible to obtain transparent edges for the smartcard in the range of visible light, ultra violet light or infrared light without significantly increasing the size of the smartcard.

In FIG. 2 it has by way of example been assumed that the edges of the first section 4 which come into contact with the edges of the compensation section 7 are straight lines when viewed from above, in other words as shown in FIG. 2. However, in order to make forgery even more difficult the shape of these edges can be different than shown in the figures. Edges whose shape is curved or serrate as seen from above make it much more difficult for a forger to assemble the parts of the smartcard into their respective places without leaving visible marks after these parts have been taken apart during a forgery attempt. In addition, in order to make forgery even more difficult, security printing can be carried out on the smartcard in such a way that the security print covers the seam between the first section 4 and the compensation section 7. Also other security elements can be arranged to cover this seam. Still another possibility is to utilize laser engraving in order to create a pattern or text on or into the compensation section alone or over the seam between the first section 4 and the compensation section 7.

Figure 3:
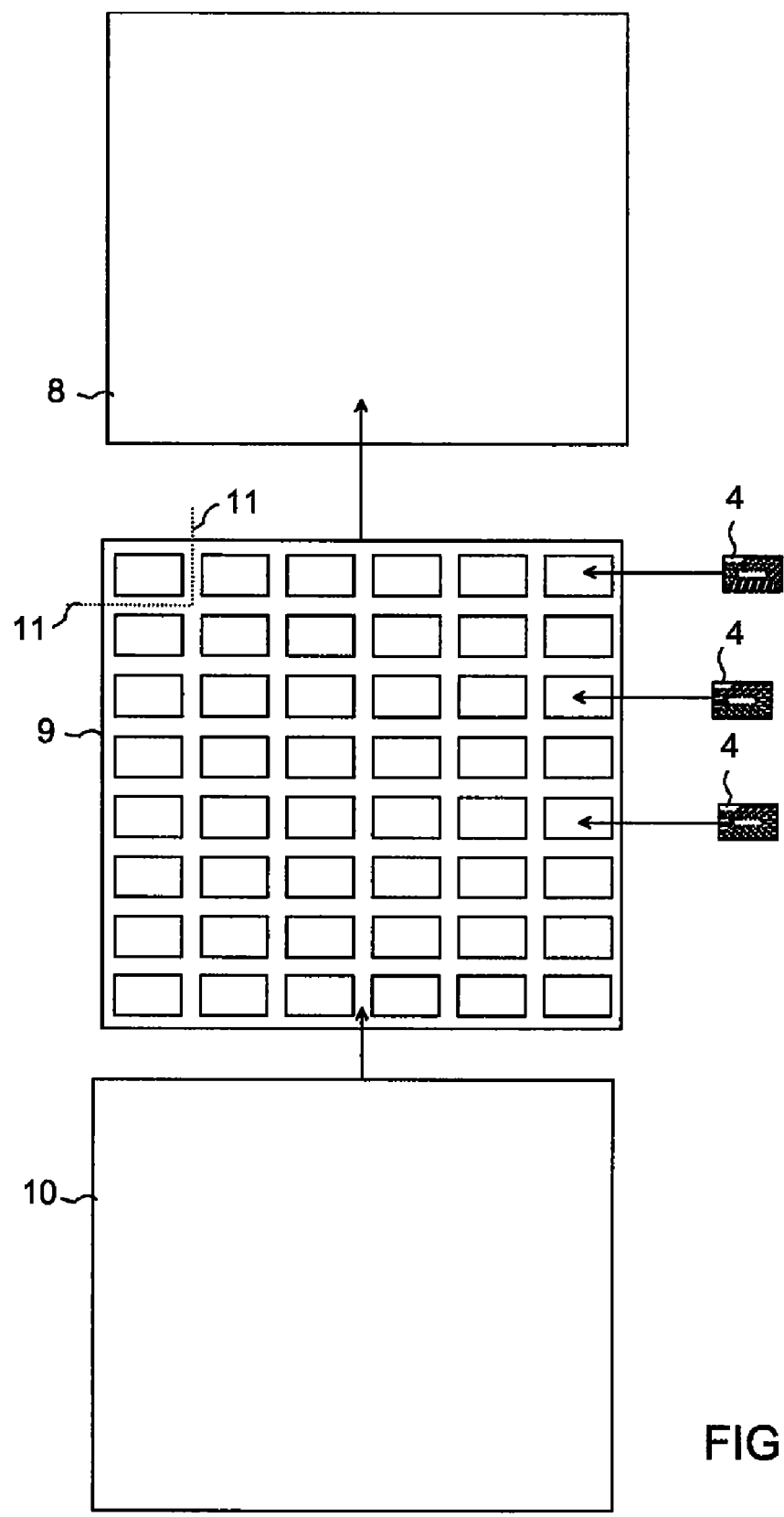
FIG. 3 illustrates a first preferred embodiment of a method for producing smartcards.

FIG. 3 illustrates a first preferred embodiment of a method for producing smartcards. In FIG. 3 a plurality of contactless microchips are in a first step separately enclosed into a first material in order to produce a plurality of first sections 4, each containing a contactless microchip. This can be done according to what has been explained previously in connection with FIGS. 1 and 2. As a result a plurality of first sections 4 is obtained as shown in FIGS. 1 and 2.

A surface section 8 of a transparent material is taken into use. In the following explanation it is assumed, by way of example, that the surface section 8 is large enough to be used as the bottom section 6 for 48 smartcards. In practice the surface section 8 may consist of a plurality of layers arranged one on top of each other.

A compensation layer 9 of a transparent material is prefabricated by punching holes into it. The dimensions of the holes are selected according to the dimensions of the first sections 4. The compensation layer 9 shown in FIG. 3 is large enough for 48 smartcards. The prefabricated compensation layer is arranged on top of the surface section 8, and the first sections 4 are arranged into the holes of the compensation layer 9.

A surface section 10 of a transparent material is taken into use. This surface section 10, which has a size corresponding to the size of the surface section 8 and the compensation layer 9, is arranged on top of the compensation layer 9 to cover the compensation layer 9 and the first sections 4. In practice the surface section 10, similarly as surface section 8, may consist of a plurality of layers arranged one on top of each other.

Finally the sections 8, 9 and 10 are attached to each other by laminating, for instance, to produce 48 smartcards that are cut apart along lines 11 as indicated for one smartcard. As a result 48 smartcards of a type corresponding to the one shown in FIGS. 1 and 2 are obtained.

If the intention is to produce smartcards where information can be printed by laser engraving, then a layer of a material suitable for laser engraving may be included in one or both of the surface sections 8 or 10, or in the first section 4. Such a layer may consist of clear carbonized polycarbonate (PC), for instance.

In the previous description it has by way of example been assumed that the various sections of the smartcard are produced of polycarbonate. Alternatively the different sections of the smartcard could be produced of PVC or Polyester or as a combination of these three materials.

It is to be understood that the above description and the accompanying Figures are only intended to illustrate the present invention. It will be obvious to those skilled in the art that the invention can be varied and modified also in other ways without departing from the scope of the invention.

The invention claimed is:

1. A smartcard comprising:
a first section enclosing a contactless microcircuit,
a compensation section of a transparent material, said compensation section having substantially the same thickness as the first section and surrounding said first section,
a top section of a transparent material, said top section being arranged on top of said first section and said compensation section as a surface layer of said smartcard, and
a bottom section of a transparent material, said bottom section being arranged under said first section and said compensation section as a surface layer of said smartcard, and wherein
said transparent top section and transparent bottom section are attached to the transparent compensation section in order to obtain transparent edges for the smartcard.

2. A smartcard according to claim 1, wherein said smartcard is at least partly manufactured of a material suitable for laser engraving.

3. A smartcard according to claim 1, wherein said microcircuit includes an antenna coiled into the material of said first section.

4. A smartcard according to claim 1, wherein the material of said first section is non-transparent.

5. A smartcard according to claim 1, wherein a non-transparent pattern covering said microcircuit is arranged to said first section or said top section.

6. A smartcard according to claim 1, wherein said transparent material is a material which is transparent in the range of visible light, ultra violet light or infrared light.

7. A method of manufacturing smartcards, said method comprises:
enclosing a plurality of contactless microcircuits separately into a material in order to produce a plurality of first sections each containing a contactless microcircuit, producing a compensation layer of a transparent material to include a plurality of holes that each have a size selected for receiving one of said first sections, arranging said compensation layer onto a surface section of a transparent material, arranging said first sections containing said microcircuits into said holes of said compensation layer, arranging a second surface section of a transparent material onto said compensation layer, attaching said sections to each other by laminating, and separating the produced smartcards from each other by cutting in order to obtain smartcards where said transparent first surface section, and said transparent second surface section are attached to said transparent compensation layer to provide transparent edges for the smartcards, such that each produced smartcard is entirely covered by transparent material.

8. A method according to claim 7, wherein said first section and at least one of said surface sections are at least partly produced of a material suitable for laser engraving.

9. A method according to claim 7, wherein said first section or at least one of said surface sections are at least partly produced of a material suitable for laser engraving.

10. A method according to claim 7, wherein at least one of: said first section, said compensation layer or said surface sections consists of a plurality of layers.

11. A method according to claim 7, wherein said method comprises encapsulating said microcircuit into a protective material from which protrudes a coiled antenna of said microcircuit, prior to enclosing said microcircuit into said material of the first section.

12. A method according to claim 7, wherein said transparent material is a material which is transparent in the range of visible light, ultra violet light or infrared light.

* * * * *